US012072762B2

(12) United States Patent
Khayat et al.

(10) Patent No.: US 12,072,762 B2
(45) Date of Patent: Aug. 27, 2024

(54) ERROR-HANDLING MANAGEMENT DURING COPYBACK OPERATIONS IN MEMORY DEVICES

(71) Applicant: Micron Technology, Inc., Boise, ID (US)

(72) Inventors: Patrick R. Khayat, San Diego, CA (US); Vamsi Pavan Rayaprolu, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 80 days.

(21) Appl. No.: 17/884,076

(22) Filed: Aug. 9, 2022

(65) Prior Publication Data
US 2024/0054046 A1 Feb. 15, 2024

(51) Int. Cl.
*G06F 11/10* (2006.01)
*G11C 29/08* (2006.01)

(52) U.S. Cl.
CPC .......... *G06F 11/1044* (2013.01); *G11C 29/08* (2013.01)

(58) Field of Classification Search
None
See application file for complete search history.

(56) References Cited

U.S. PATENT DOCUMENTS

| | | | |
|---|---|---|---|
| 11,093,322 B1* | 8/2021 | Cai | G11C 16/08 |
| 2006/0039196 A1* | 2/2006 | Gorobets | G11C 29/76 |
| | | | 714/E11.038 |
| 2012/0213001 A1* | 8/2012 | Yang | G11C 16/28 |
| | | | 365/185.2 |
| 2013/0117635 A1* | 5/2013 | Ok | G11C 29/021 |
| | | | 714/E11.054 |
| 2013/0272065 A1* | 10/2013 | Cornwell | G11C 29/78 |
| | | | 365/185.03 |
| 2015/0261604 A1* | 9/2015 | Sugiyama | G11C 29/42 |
| | | | 714/764 |
| 2016/0103735 A1* | 4/2016 | Lee | H03M 13/1545 |
| | | | 714/764 |
| 2016/0179617 A1* | 6/2016 | Lee | G06F 11/1048 |
| | | | 714/755 |
| 2018/0013451 A1* | 1/2018 | Kaynak | G11C 29/52 |
| 2018/0074892 A1* | 3/2018 | Shappir | G11C 29/52 |
| 2018/0074894 A1* | 3/2018 | Sakurada | G11C 16/10 |
| 2019/0138392 A1* | 5/2019 | Jung | G11C 11/5642 |

(Continued)

*Primary Examiner* — Guerrier Merant
(74) *Attorney, Agent, or Firm* — LOWENSTEIN SANDLER LLP

(57) ABSTRACT

Systems and methods are disclosed including a memory device and a processing device operatively coupled to the memory device. The processing device can perform operations comprising selecting a source set of memory cells of the memory device, performing a data integrity check on the source set of memory cells to obtain a data integrity metric value; responsive to determining that a data integrity metric value satisfies the threshold criterion, performing a first error-handling operation on the data stored on the source set of memory cells; responsive to determining that the first error-handling operation fails to correct the data, performing a second error-handling operation on the data; and responsive to determining that the second error-handling operation corrected the data, causing the memory device to copy the corrected data to a destination set of memory cells of the memory device.

20 Claims, 11 Drawing Sheets

(56) References Cited

U.S. PATENT DOCUMENTS

| | | | |
|---|---|---|---|
| 2022/0180961 A1* | 6/2022 | Su | G11C 29/42 |
| 2023/0116755 A1* | 4/2023 | Linnen | G06F 3/0688 |
| | | | 711/114 |
| 2023/0297470 A1* | 9/2023 | Kaynak | H03M 13/2906 |
| | | | 714/755 |

* cited by examiner

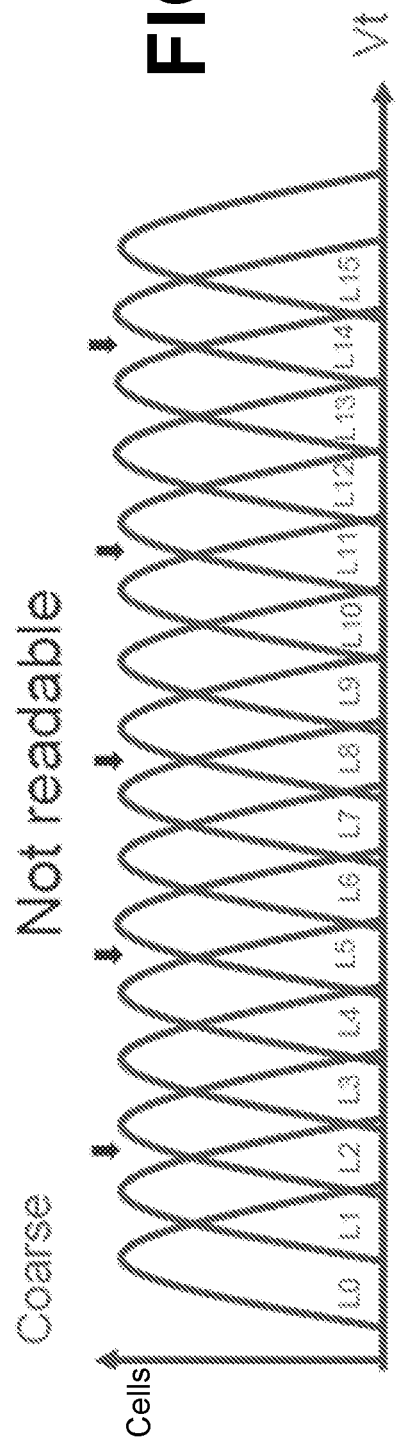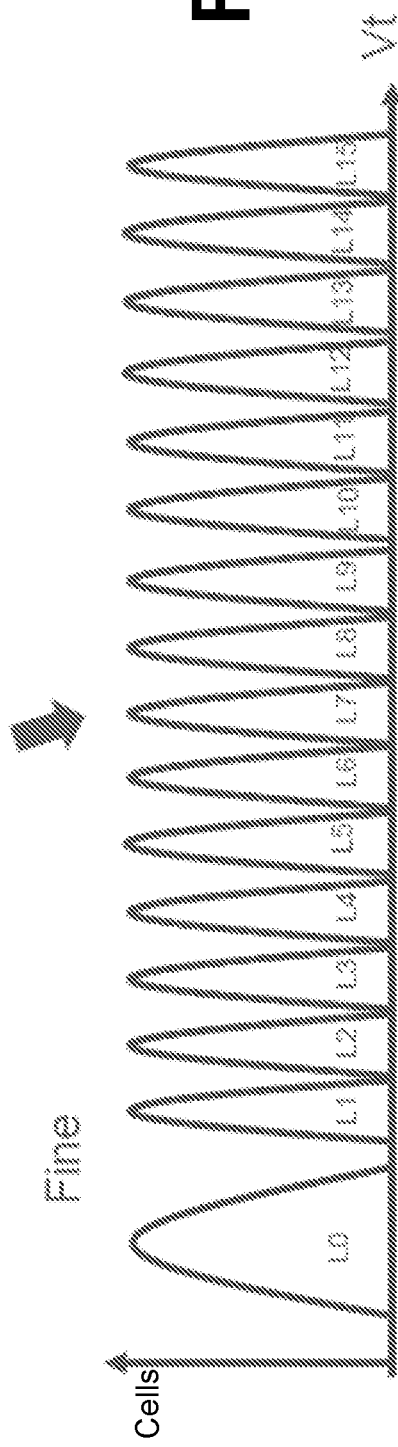

ERROR-HANDLING MANAGEMENT DURING COPYBACK OPERATIONS IN MEMORY DEVICES

TECHNICAL FIELD

Embodiments of the disclosure relate generally to memory sub-systems, and more specifically, relate to error-handling management during copyback operations in memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 5A is a graph illustrating an example of a set of threshold voltage distributions, after coarse programming, that are not readable according to at least one embodiment.

FIG. 5B is a graph illustrating the example of the set of threshold voltage distributions, after fine programming, that are readable according to at least one embodiment.

DETAILED DESCRIPTION

Figure 1A:
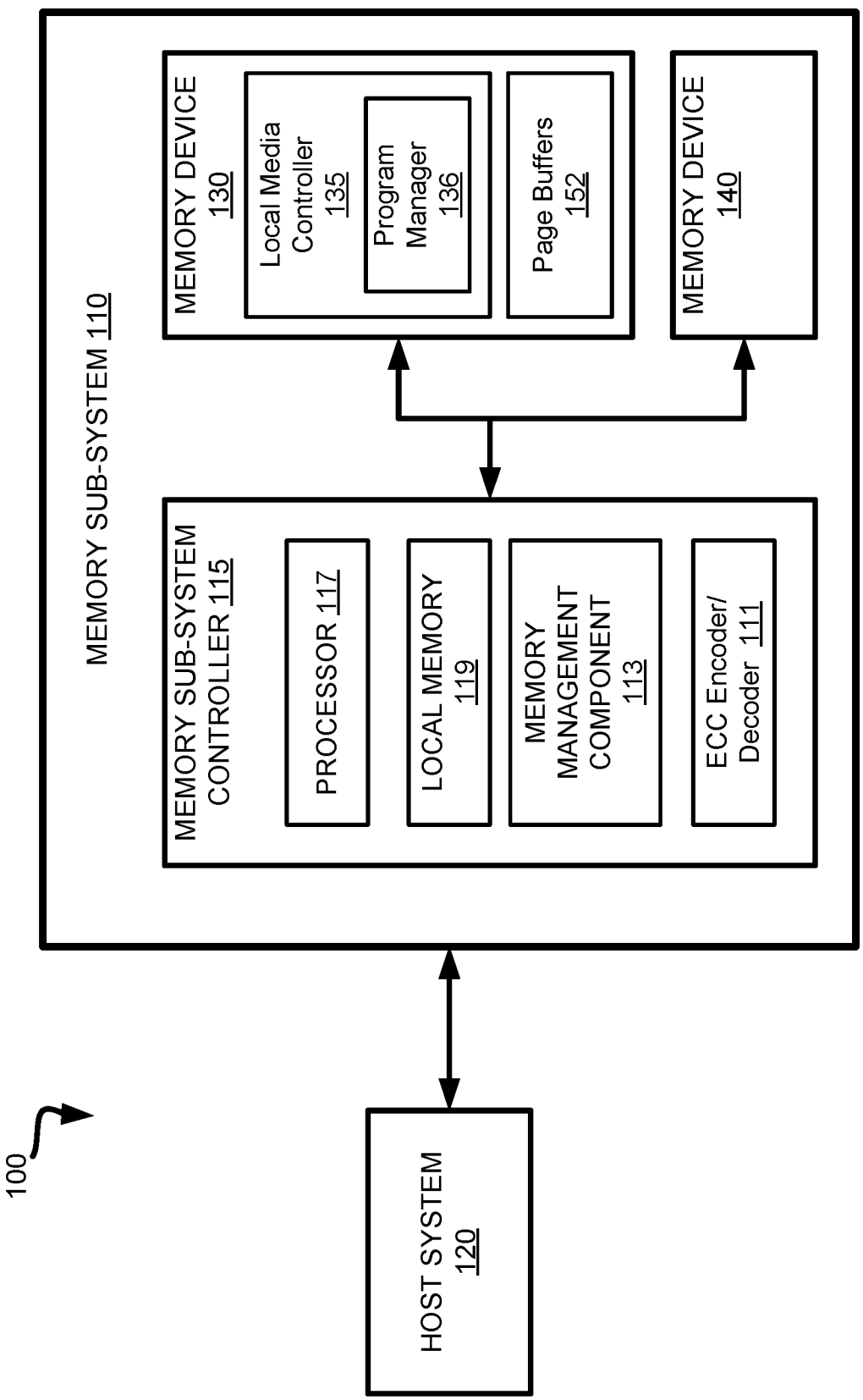
FIG. 1A illustrates an example computing system that includes a memory sub-system in accordance with some embodiments of the present disclosure.

Aspects of the present disclosure are directed to error-handling management during copyback operations in memory devices. A memory sub-system can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1A-1B. A non-volatile memory device is a package of one or more dies. Each die can include two or more planes. For some types of non-volatile memory devices (e.g., NAND devices), each plane includes of a set of physical blocks. In some implementations, each block can include multiple sub-blocks. Each plane carries a matrix of memory cells formed on a silicon wafer and joined by conductors referred to as wordlines (WLs) and bitlines (BLs), such that a wordline joins multiple memory cells forming a row of the matrix of memory cells, while a bitline joins multiple memory cells forming a column of the matrix of memory cells.

Depending on the cell type, each memory cell can store one or more bits of binary information, and has various logic states that correlate to the number of bits being stored. The logic states can be represented by binary values, such as "0" and "1," or combinations of such values. A memory cell can be programmed (written to) by applying a certain voltage to the memory cell, which results in an electric charge being held by the memory cell, thus allowing modulation of the voltage distributions produced by the memory cell. A set of memory cells referred to as a memory page can be programmed together in a single operation, e.g., by selecting consecutive bitlines.

A memory sub-system can use a striping scheme to treat various sets of data as units when performing data operations (e.g., write, read, erase, etc.). A die stripe refers to a collection of planes that are treated as one unit when writing, reading, or erasing data. A controller of a memory device (i.e., a memory sub-system controller, a memory device controller, etc.) can execute the same operation can carry out the same operation, in parallel, at each plane of a dice stripe. A block stripe is a collection of blocks, at least one from each plane of a die stripe, that are treated as a unit. The blocks in a block stripe can be associated with the same block identifier (e.g., block number) at each respective plane. A page stripe is a set of pages having the same page identifier (e.g., the same page number), across a block stripe, and treated as a unit.

A page cache (or buffer) is a circuit block comprising a number of memory elements and additional circuitry. Each page cache can be coupled to a bitline and used to latch data sensed from the memory array during a read operation, and to store data to be programmed into the memory array (e.g., the page cache stores data read from the memory array, or host data to be written to the memory array). The page cache includes static memory elements, such as a primary data cache (PDC) and a secondary data cache (SDC). The PDC holds data that is used to keep the bit line at a voltage level sufficient to shift a threshold voltage of a memory cell during programming, or to sense the data from a bit line during a read operation. The SDC is a memory element accessible to the host system and is used as a data read/write buffer. The PDC and SDC are independent from one another. The page cache can further include a sense amplifier to read data from memory cells, and dynamic memory elements. The memory sub-system controller can move data in the PDC to the SDC to allow it to be read by the host system, or to any of the dynamic memory elements for use in logical operations Precisely controlling the amount of the electric charge stored by the memory cell allows establishing multiple logical levels, thus effectively allowing a single memory cell to store multiple bits of information. A read operation can be performed by comparing the measured threshold voltages (V t) exhibited by the memory cell to one or more reference voltage levels in order to distinguish between two logical levels for single-level cell (SLCs) and between multiple logical levels for multi-level cells. A memory device can include multiple portions, including, e.g., one or more portions where the sub-blocks are configured as SLC memory and one or more portions where the sub-blocks are configured as multi-level cell (MLC) memory that can store three bits of information per cell and/or (triple-level cell) TLC memory that can store three bits of information per cell. The voltage levels of the memory cells in TLC memory form a set of 8 programming (or threshold voltage (Vt)) distributions representing the 8 different combinations of the three bits stored in each memory cell. Depending on how the memory cells are configured, each physical memory page in one of the sub-blocks can include multiple page types. For example, a physical memory page formed from single level cells (SLCs) has a single page type referred to as a lower logical page (LP). Multi-level cell (MLC) physical page types can include LPs and upper logical pages (UPs) and store two bits of information per cell. Further, TLC physical page types can include LPs, UPs, and extra logical pages (XPs) and store three bits of information per cell. Further, quad-level (QLC) physical page types can include LPs, UPs, XPs and top logical pages (TPs) and store four bits of information per cell. For example, a physical memory page formed from memory cells of the QLC memory type have a total of four logical pages, where each logical page stores data distinct from the data stored in the other logical pages associated with that physical memory page, herein referred to as a "page." MLC memory, TLC memory, QLC memory and PLC memory can be referred to as higher-level cell (HLC) memory.

A memory device typically experiences random workloads, which can impact the threshold voltage (Vt) distributions, which can be shifted to higher or lower values. Further, the read window budget (RWB), e.g., formed from the read window margins (FIG. 4) between threshold voltage distributions, can be impacted by cell-to-cell interference. If these read window margins are degraded from widening Vt distributions, it can be difficult to read the logical states out of the memory cells, resulting in an increased read bit error rate (RBER). Cell-to-cell interference occurs when a next logical program of memory cells (e.g., coupled with WLn+1) causes the threshold voltage (Vt) distribution of victim memory cells (e.g., coupled with WLn) to widen, thus degrading the read window margins between Vt distributions of the WLn victim memory cells. In this scenario, the memory cells associated with WLn+1 are physically adjacent to (e.g., above) the memory cells associated with WLn. This cell-to-cell interference imparted to the WLn memory cells is a function of the WLn+1 aggressor memory cells incurring a threshold voltage (Vt) swing when being programmed from an erase state to a set of threshold voltage distributions.

Thus, to minimize cell-to-cell interference, certain memory devices utilize a two-pass, coarse-fine programming algorithm, in which the memory cells associated with WLn first undergo a coarse programming that results in unreadable Vt distributions (FIG. 5A). Then, later, after the aggressor memory cells associated with WLn+1 have also been coarse programmed, the memory cells associated with WLn are fine programmed. When this alternating nature of coarse-to-fine programming across wordlines is followed to store a page of data along WLn and another page of data along WLn+1, final read window margins of a set of threshold voltage distributions become readable (FIG. 5B). In this way, there is a transition by the WLn+1 aggressor memory cells being programmed from an erased Vt distribution to a coarse set of Vt distributions instead of going directly from the erased Vt distribution to the final set of fine Vt distributions, enabling reduction in the cell-to-cell interference as programming progresses due to incurring smaller Vt swings with each programming operation. With a coarse-fine programming algorithm, for example, read window margins for QLC-programmed memory cells can be significantly improved to achieve maximum bits-per-cell for bit-cost scaling. Further, this coarse-fine programming algorithm can help reduce quick charge loss (QCL), which is also referred to as temporal voltage shift, by reducing programmed Vt swings of memory cells.

The coarse-fine programming algorithm can use SLC memory that is dedicated to buffer QLC data that is being programmed. This buffering of data is required because coarse-programmed Vt distributions have heavily-overlapped states (FIG. 5A), and thus are unreadable while waiting to undergo fine programming into final Vt distributions that are readable (FIG. 5B). Thus, the QLC data is first buffered in SLC blocks of memory so the QLC data is available for the fine programming. For example, according to one coarse-fine programming algorithm of QLC memory, at least 5 coarse QLC pages of data (or approximately 20 SLC pages of data) to be programmed across two adjacent wordlines need to be buffered in SLC blocks.

Accordingly, to perform the coarse-fine programming, some memory systems use a folding operation in which data is copied from the SLC memory to the QLC memory (or any HLC memory). The folding process allows for compacting data from the SLC memory into the QLC memory, as multiple bits of SLC data can be stored within a single cell of the QLC memory.

In some memory devices, a folding operation involves data transfers from the memory device to the memory sub-system controller via a data bus (such as an open NAND flash interface or "ONFI" bus), where valid data is read from a source block, subject to error correction (via, for example, error correction code (ECC)) on the memory sub-system controller, and programmed back to a destination block on the memory device. During the ECC operation, the memory device can utilize a program suspend protocol. In particular, in order to reduce latency in mixed workloads (e.g., a combination of write operations and read operations, such as a read operation followed immediately by a write operation), certain memory sub-systems utilize a program suspend protocol to allow subsequently received memory access commands (e.g., read command) to access the memory device on which a write operation is currently being performed. The program suspend protocol can temporarily pause the write operation to allow access to the memory array. In particular, when the memory sub-system receives a request to perform a memory access operation on the data stored in a certain page of the memory device while a write operation is in progress, the memory sub-system controller can issue a program suspend command, which causes the memory device to enter a suspended state. During the suspended state, the write data can be stored on a page cache (e.g., the SDC).

In some instances, the ECC operation may fail to correct the error(s) in the write data. Accordingly, the memory sub-system controller can initiate a set of error-handling techniques to correct the errors. However, some error-handling techniques can require latch resources, thus causing the memory sub-system controller to overwrite the data stored in a page cache (e.g., the SDC)). This can cause memory devices to incur significant performance penalties in latency, e.g., in restarting a previously folding copyback operation.

Aspects of the present disclosure address the above and other deficiencies by causing the memory sub-system controller to perform error-handling techniques during copyback operations in a memory device. In particular, the memory sub-system controller can perform operations to optimize the overall performance of the memory device by performing particular error-handling techniques during copyback operations. In some embodiments, the memory subsystem controller can first select a particular copyback operation for memory compaction. The copyback operation can be a corrective copyback operation or an internal copyback operation. The corrective copyback operation can include sending data from a source block to a memory sub-system controller to perform error corrections or a refresh of the data stored in the source memory cells before programming the data to a destination block. For example, the memory sub-system controller can perform a scan of the data by reading the data out from the memory device, decoding the source data according to an error correction code (ECC) algorithm, and performing an error check on the source data. The memory sub-system controller can then use one or more ECC-based error-handling techniques to correct any detected errors. Once the data is corrected, the memory sub-system controller can send the corrected data to the memory device to be programmed to the destination block. The internal copyback operation can include folding data from the source memory cells to the destination memory cells directly, without intervention by the memory sub-system controller.

In an illustrative example, in response to a write command, the memory sub-system controller can program the data reflected in the write command to an SLC cache on the memory device. The memory sub-system controller can then select a set of SLC data to program (e.g., via two-pass, coarse-fine programming) into QLC memory. For example, the memory sub-system controller can select four SLC blocks from the SLC cache to program into a QLC block. In other embodiments, any other granularities of memory can be used, such as stripes (e.g., SLC stripes, QLC stripes, etc., where, for example, an SLC stripe and a QLC stripe can be a collection of SLC memory pages and QLC memory pages, respectively, that are associated with the same respective identifier across multiple planes), memory pages (SLC memory pages, QLC memory pages, etc.), etc.

The memory sub-system controller (or memory device logic) can perform a data integrity check on a portion of the SLC blocks. For example, the data integrity check can include the memory sub-system controller reading data from a set of sampled memory cells in the SLC blocks. The data integrity check can verify that the data stored at memory cells does not include any errors, or that the number of errors are suitably low. In one example, the memory sub-system controller identifies a data integrity metric, such as the bit error count (BEC) or the raw bit error rate (RBER), representing a number of bit errors per unit of time that the data stored at the data block experiences. The memory sub-system controller can then determine whether a value of the data integrity metric (e.g., a BEC value, a RBER value, etc.) satisfies a threshold criterion (e.g., meets or exceeds a threshold value). If the data integrity metric fails to satisfy the threshold criterion (e.g., BEC or RBER value is below a threshold value), the memory sub-system controller can instruct the memory device to perform an internal copyback with respect to the set of SLC blocks. The memory device can then program the data from the set of SLC blocks to a QLC block. This allows the memory device to determine the integrity of the data prior to performing an internal copyback operation since errors in SLC data can be amplified and thus become uncorrectable once copied into QLC memory. By determining which copyback operation to use, the memory sub-system controller is therefore capable of ensuring the SLC data is sufficiently error free prior to programming the data into QLC memory. If the data integrity metric satisfies a threshold criterion (e.g., BEC or RBER value is above a threshold value), indicating a high error rate associated with data stored at the SLC blocks, the memory sub-system controller sends, to the memory device, a corrective copyback command. A corrective copyback operation includes sending, to the memory device, instructions to wait for the memory sub-system controller to perform ECC-based error correction operations or a refresh of the data stored in the memory cells of the source block before initiating a folding operation of the source data (e.g., the SLC blocks). In some embodiments, the memory sub-system controller performs a scan of the data by reading the data out from the memory device, decoding the source data according to an error correction code (ECC) algorithm, and performing an error check on the source data. The memory sub-system controller can then use one or more ECC-based error-handling techniques to correct any detected errors. Once the data is corrected, the memory sub-system controller can send the corrected data to the memory device to be programmed to the destination block (e.g., the QLC block). During the error-handling procedure, the memory device can utilize a program suspend protocol. The program suspend protocol can temporarily pause the write operation to allow access to the memory array.

In some embodiments, the ECC-based error-handling techniques can fail to correct the data. This may be because the BEC or the RBER is too high for ECC-based error-handling capabilities. Accordingly, the memory sub-system controller can perform one or more "shallow" error-handling techniques. A shallow error-handling technique can include error-handling operations that do not use significant latch resources (e.g., the PDC and SDC(s)). Thus, shallow error-handling techniques can be performed during the program suspend protocol because they do not require the memory sub-system controller to overwriting data from the page cache (e.g., the SDC)). If the shallow error-handling techniques correct the data, the memory sub-system controller can resume the copyback operation and send the corrected data to the memory device to be programmed to the destination block (e.g., the QLC block). If the shallow error-handling operations fail to correct the data, the memory sub-system controller can exit the copyback operation (thus exiting program suspend protocol) and perform one or more "deep" error-handling techniques (e.g., corrective read (CR) operations, redundant array of independent NAND (RAIN) scheme, forward error correction (FEC), hybrid automatic repeat request (HARQ), etc.). Once the data is corrected, the memory sub-system controller can retire the initial SLC block and program the corrected data to a new SCL block.

Advantages of the systems and methods implemented in accordance with some embodiments of the present disclosure include, but are not limited to, a reduction in complexity and improvement in performance of compacting data stored in SLC memory cells to QLC memory cells during programming operations (e.g., coarse-fine programming). This increase in performance includes reduced latency, particularly when the processing device needs take no further action before the internal copyback is performed, and less congestion on a data bus (e.g., ONFI bus) located between the memory sub-system controller and the memory device when avoiding reading out and error checking the SLC data. In addition, when error checking is needed, advantages of the present disclosure enable the memory sub-system controller to perform specific error-handling operation that do not require exiting the copyback operation or program suspend protocol. Other advantages will be apparent to those skilled in the art of folding data within memory devices, which will be discussed hereinafter. Although embodiments are described using wordlines of a NAND flash memory, aspects of the present disclosure can be applied to other types of memory sub-systems.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g. 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local controller 132) on the die and a controller (e.g., memory sub-system controller 115) for media management within the same memory device package. An example of a managed memory device is a managed NAND (MNAND) device.

In some embodiments, the controller 115 (e.g., processing device) includes an error-correcting code (ECC) encoder/decoder 111. The ECC encoder/decoder 111 can perform ECC encoding for data written to the memory devices 130 and ECC decoding for data read from the memory devices 130, respectively. The ECC decoding can be performed to decode an ECC codeword to correct errors in the raw read data, and in many cases also to report the number of bit errors in the raw read data. The memory sub-system controller 115 can further include a processor 117 (processing device) configured to execute instructions stored in local memory 119 for performing the operations described herein. The local memory 119 can also buffer data being used by the executed instructions. Example ECC processes can include parity checks, Hamming codes, checksums, cyclic redundancy checks (CRCs), cryptographic hashes, block codes, convolutional codes, turbo codes, low-density parity check (LDPC), etc.

In at least some embodiments, the controller 115 further includes a memory management component 113 that can handle interactions of the controller 115 with the memory devices of the memory sub-system 110, such as with the memory device 130. For example, the memory management component 113 can determine whether to perform an internal copyback operation or a corrective copyback operation with respect to source data stored on a block. An internal copyback operation includes sending an internal copyback command to memory device 130, 140 with instructions to perform a copyback of data from source memory cells to destination memory cells without further intervention by the controller 115. A corrective copyback operation includes sending a corrective copyback command to memory device 130, 140 with instructions to wait for the controller 115 to perform error correction or a refresh of the data stored in the source memory cells before performing a copyback operation. In some embodiments, the memory management component 113 can perform error-handling operations on data stored on memory device 130, 140. In some embodiments, the memory sub-system controller 115 includes at least a portion of the memory management component 113. In some embodiments, the memory management component 113 is part of the host system 120, an application, or an operating system. In other embodiments, local media controller 135 includes at least a portion of memory management component 113 and is configured to perform the functionality described herein. The memory management component 113 can communicate directly with the memory devices 130 and 140 via a synchronous interface. Furthermore, transfers of data between the memory device 130 and the memory device 140 can be done within the memory sub-system 110 without accessing the host system 120.

In various embodiments, the memory device 130 further includes one or more page buffers 152, which can provide the circuitry used to program data to the memory cells of the memory device 130 and to read the data out of the memory cells. The local media controller 135 can further include a program manager 136, which is implemented using firmware, hardware, or a combination of firmware and hardware. In one embodiment, the program manager 136 receives an internal copyback command and/or a corrective copyback command from the memory management component 113. The program manager 136 can execute the internal copyback command by performing a copyback of data from source memory cells to destination memory cells without further intervention by the controller 115, or execute the corrective copyback command by waiting for the controller 115 to perform error correction or a refresh of the data stored in the source memory cells before performing a copyback operation. In some embodiments, the program manager 136 is part of the host system 120, an application, or an operating system. In some embodiments, control logic of the local media controller 135 and/or program manager 136 can implement or direct the consecutive coarse and fine programming operations on a set of memory cells and other related operations described herein. In some embodiments, this control logic is integrated in whole or in part within the memory sub-system controller 115 and/or the host system 120. Further details with regards to the operations of program manager 136 are described below.

Figure 1B:
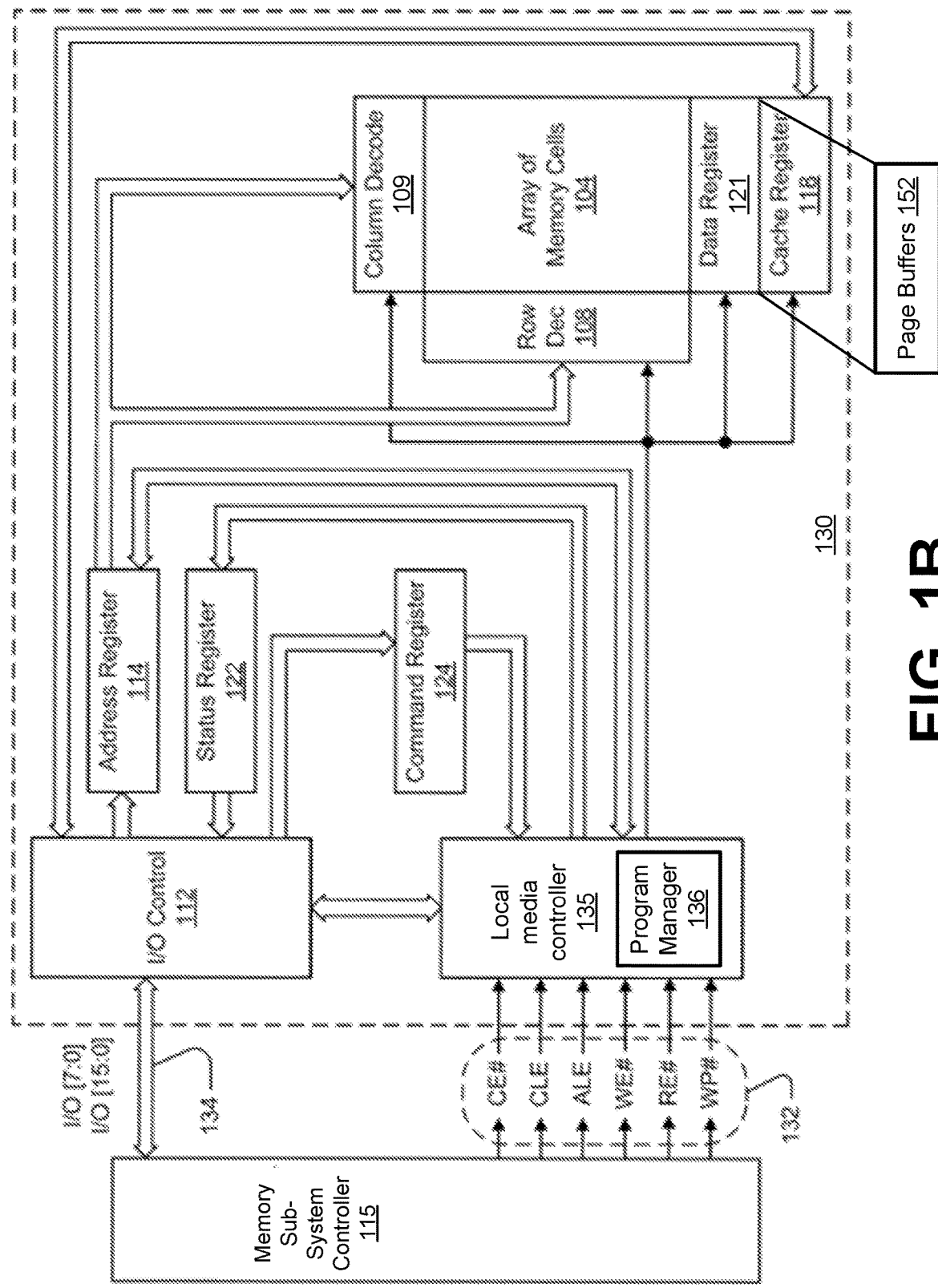
FIG. 1B is a block diagram of a memory device in communication with a memory sub-system controller of a memory sub-system in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., the memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

The memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bitline). A single access line can be associated with more than one logical row of memory cells and a single data line can be associated with more than one logical column. Memory cells (not shown in FIG. 1B) of at least a portion of the array of memory cells 104 are capable of being programmed to one of at least two target data states.

Row decode circuitry 108 and column decode circuitry 109 are provided to decode address signals. Address signals are received and decoded to access the array of memory cells 104. The memory device 130 also includes input/output (I/O) control circuitry 112 to manage input of commands, addresses and data to the memory device 130 as well as output of data and status information from the memory device 130. An address register 114 is in communication with the I/O control circuitry 112 and row decode circuitry 108 and column decode circuitry 109 to latch the address signals prior to decoding. A command register 124 is in communication with the I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses. The local media controller 135 can also include the program manager 136, as was discussed.

The local media controller 135 is also in communication with a cache register 118 and a data register 121. The cache register 118 latches data, either incoming or outgoing, as directed by the local media controller 135 to temporarily store data while the array of memory cells 104 is busy writing or reading, respectively, other data. During a program operation (e.g., write operation), data can be passed from the cache register 118 to the data register 121 for transfer to the array of memory cells 104; then new data can be latched in the cache register 118 from the I/O control circuitry 112. During a read operation, data can be passed from the cache register 118 to the I/O control circuitry 112 for output to the memory sub-system controller 115; then new data can be passed from the data register 121 to the cache register 118. The cache register 118 and/or the data register 121 can form (e.g., can form at least a portion of) a page buffer of the one or more page buffers 152 of the memory device 130. Each page buffer can further include sensing devices such as a sense amplifier, to sense a data state of a memory cell of the array of memory cells 104, e.g., by sensing a state of a data line connected to that memory cell. A status register 122 can be in communication with I/O control circuitry 112 and the local memory controller 135 to latch the status information for output to the memory sub-system controller 115.

The memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands can be received over input/output (I/O) pins [7:0] of I/O bus 134 at I/O control circuitry 112 and can then be written into a command register 124. The addresses can be received over input/output (I/O) pins [7:0] of I/O bus 134 at I/O control circuitry 112 and can then be written into address register 114. The data can be received over input/output (I/O) pins [7:0] for an 8-bit device or input/output (I/O) pins [15:0] for a 16-bit device at I/O control circuitry 112 and then can be written into cache register 118. The data can be subsequently written into data register 121 for programming the array of memory cells 104.

In an embodiment, cache register 118 can be omitted, and the data can be written directly into data register 121. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) can be used in the various embodiments.

Figure 2A:
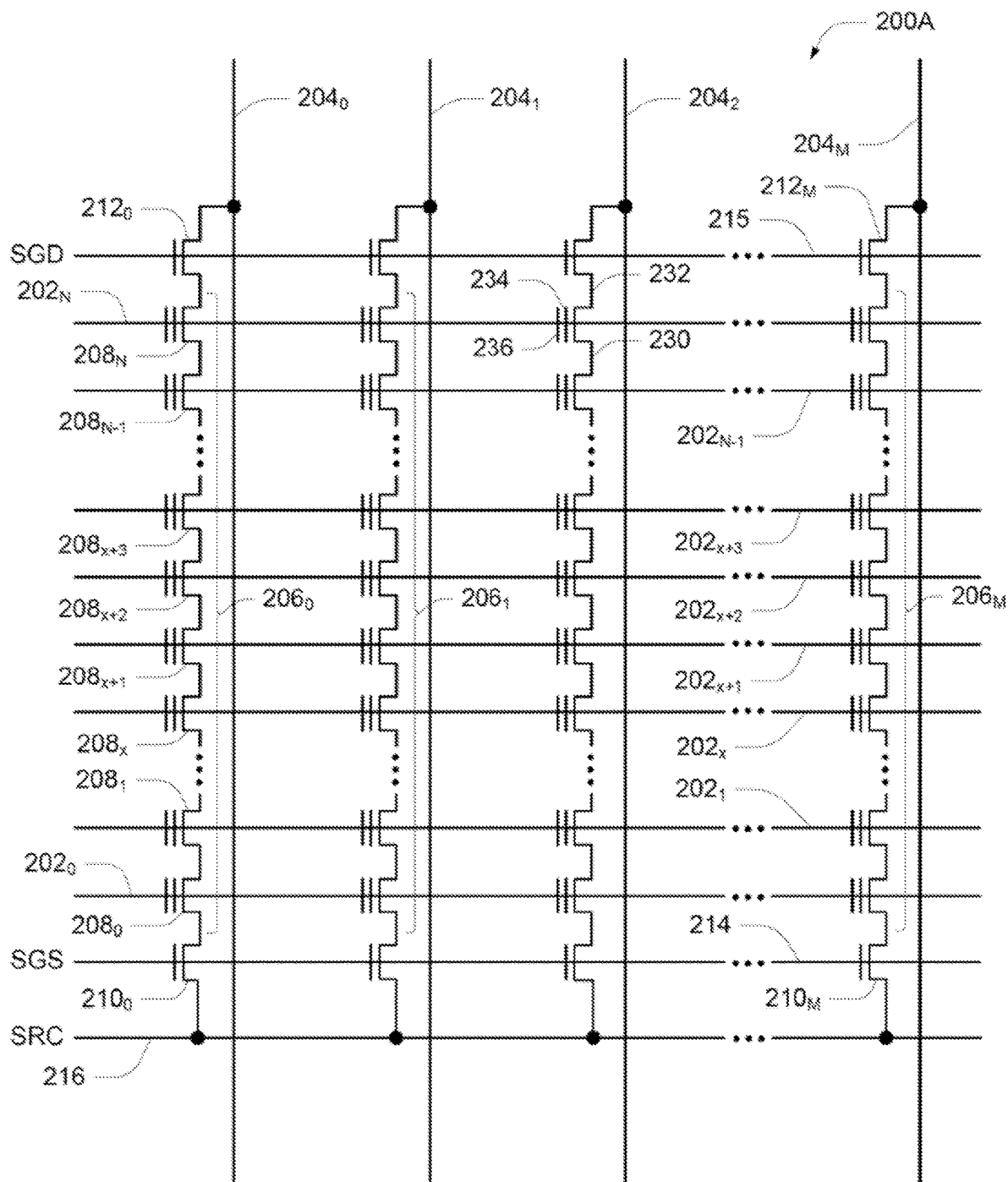
FIGS. 2A-2B are schematics of portions of an array of memory cells as could be used in a memory of the type described with reference to FIG. 1B in accordance with some embodiments of the present disclosure.
Figure 2B:
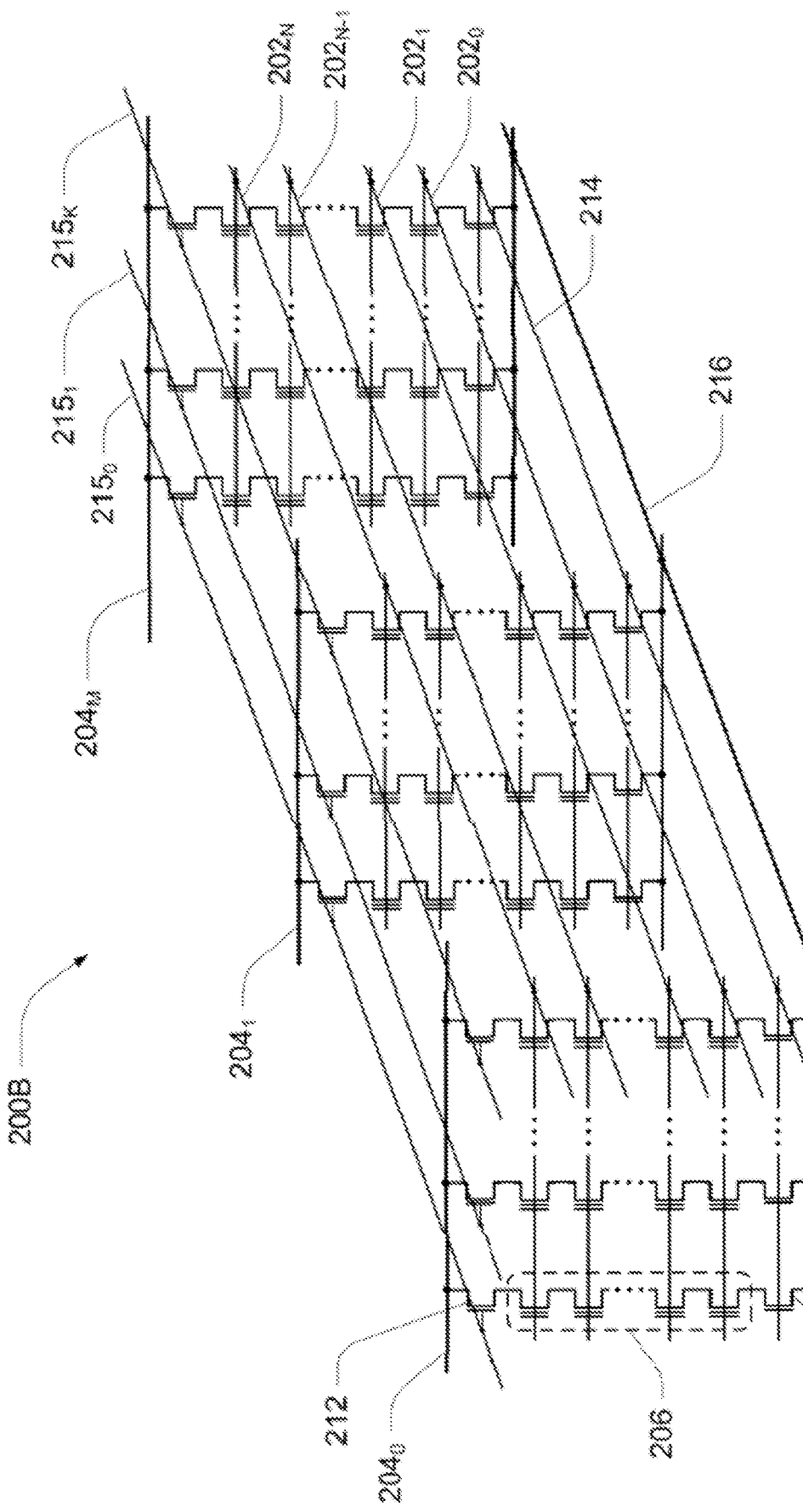

FIG. 2A-2B are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as wordlines $202_0$ to $202_N$, and data lines, such as bitlines $204_0$ to $204_M$. The wordlines 202 can be connected to global access lines (e.g., global wordlines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n well.

Memory array 200A can be arranged in rows (each corresponding to a wordline 202) and columns (each corresponding to a bitline 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. Each bitline 204 and NAND string 206 can be associated with a sub-block of a set of sub-blocks of the memory array 200A. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bitline 204 for the corresponding NAND string 206. For example, the drain of select gate $212_0$ can be connected to the bitline $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bitline 204. A control gate of each select gate 212 can be connected to select line 215.

The memory array 200A in FIG. 2A can be a quasi-two-dimensional memory array and can have a generally planar structure, e.g., where the common source 216, NAND strings 206 and bitlines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bitlines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bitline 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bitlines 204 (e.g., bitlines $204_0$, $204_2$, $204_4$, etc.) can be one physical page of the memory cells 208 (e.g., even memory cells) while memory cells 208 commonly connected to wordline $202_N$ and selectively connected to odd bitlines 204 (e.g., bitlines $204_1$, $204_3$, $204_5$, etc.) can be another physical page of the memory cells 208 (e.g., odd memory cells).

Although bitlines $204_3$ $204_5$ are not explicitly depicted in FIG. 2A, it is apparent from the figure that the bitlines 204 of the array of memory cells 200A can be numbered consecutively from bitline $204_0$ to bitline $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bitline $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bitline 204. Subsets of NAND strings 206 can be connected to their respective bitlines 204 by biasing the select lines $215_0$-$215_K$ to selectively activate particular select transistors 212 each between a NAND string 206 and a bitline 204. The select transistors 210 can be activated by biasing the select line 214. Each wordline 202 can be connected to multiple rows of memory cells of the memory array 200B. Rows of memory cells that are commonly connected to each other by a particular wordline 202 can collectively be referred to as tiers.

Figure 3:
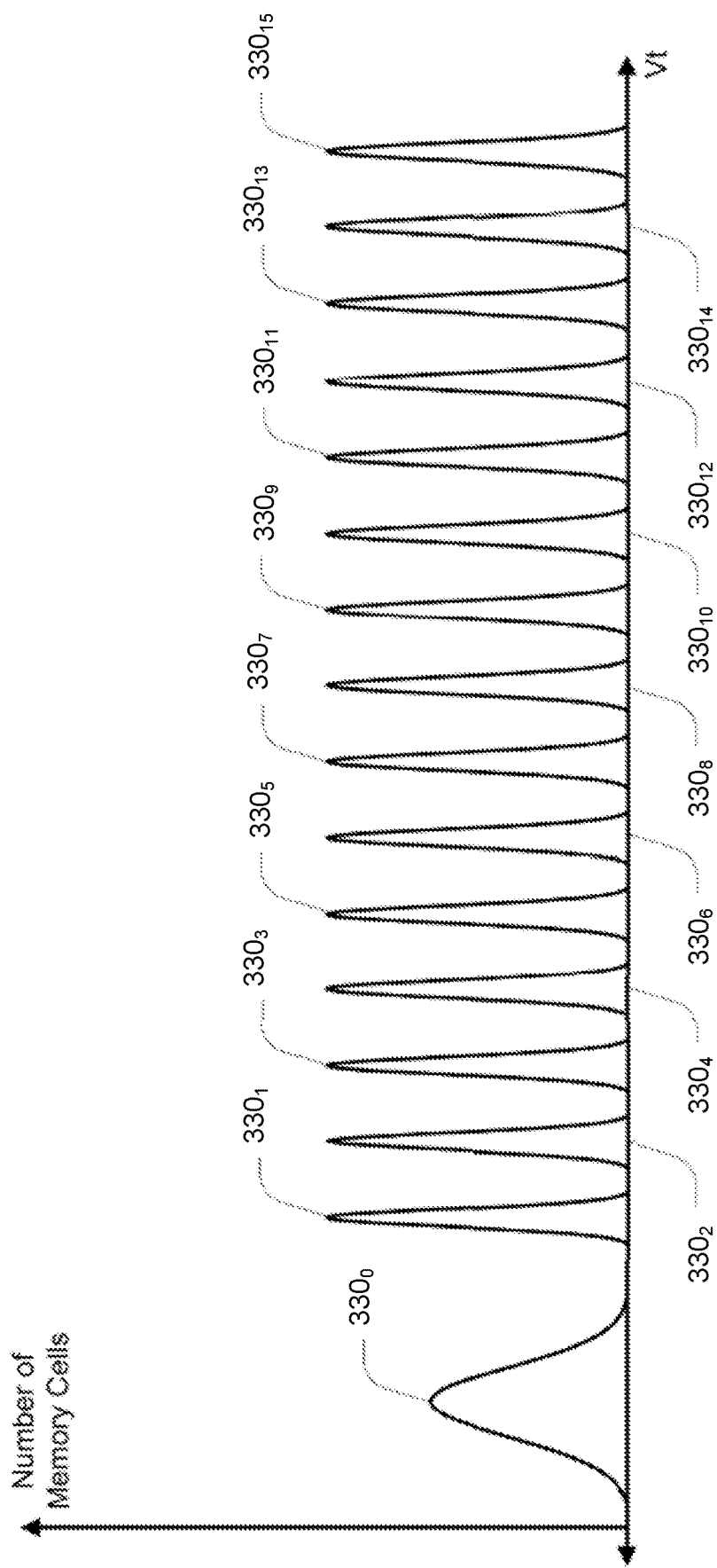
FIG. 3 is a conceptual depiction of threshold voltage distributions of multiple memory cells of a memory array according to an embodiment.

FIG. 3 is a conceptual depiction of threshold voltage ranges of multiple memory cells. FIG. 3 illustrates an example of threshold voltage ranges and their distributions for a population of a sixteen-level memory cells, e.g., QLC memory cells. For example, such a memory cell can be programmed to a threshold voltage (Vt) that falls within one of sixteen different threshold voltage ranges $330_0$-$330_{15}$, each being used to represent a data state corresponding to a bit pattern of four bits. The threshold voltage range $330_0$ typically has a greater width than the remaining threshold voltage ranges $330_1$-$330_{15}$ as memory cells are generally all placed in the data state corresponding to the threshold voltage range $330_0$, then subsets of those memory cells are subsequently programmed to have threshold voltages in one of the threshold voltage ranges $330_1$-$330_{15}$. As programming operations are generally more incrementally controlled than erase operations, these threshold voltage ranges $330_1$-$330_{15}$ can tend to have tighter distributions.

TABLE 1

| Data State | Logical Data Value |
|---|---|
| L0 | 1111 |
| L1 | 0111 |
| L2 | 0011 |
| L3 | 1011 |
| L4 | 1001 |
| L5 | 0001 |
| L6 | 0101 |
| L7 | 1101 |
| L8 | 1100 |
| L9 | 0100 |
| L10 | 0000 |
| L11 | 1000 |
| L12 | 1010 |
| L13 | 0010 |
| L14 | 0110 |
| L15 | 1110 |

The threshold voltage ranges $330_0$, $330_1$, $330_2$, $330_3$, $330_4$, $330_5$, $330_6$, $330_7$, $330_8$, $330_9$, $330_{10}$, $330_{11}$, $330_{12}$, $330_{13}$, $330_{14}$, and $330_{15}$ can each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $330_0$, the memory cell in this case can be storing a data state L0 having a data value of logical '1111' and is typically referred to as the erased state of the memory cell. If the threshold voltage is within the second of the sixteen threshold voltage ranges $330_1$, the memory cell in this case can be storing a data state L1 having a data value of logical '0111'. If the threshold voltage is within the third of the sixteen threshold voltage ranges $330_2$, the memory cell in this case can be storing a data state L2 having a data value of logical '0011,' and so on. Table 1 provides one possible correspondence between the data states and their corresponding logical data values. Other assignments of data states to logical data values are known or can be envisioned. Memory cells remaining in the lowest data state (e.g., the erased state or L0 data state), as used herein, will be deemed to be programmed to the lowest data state.

Figure 4:
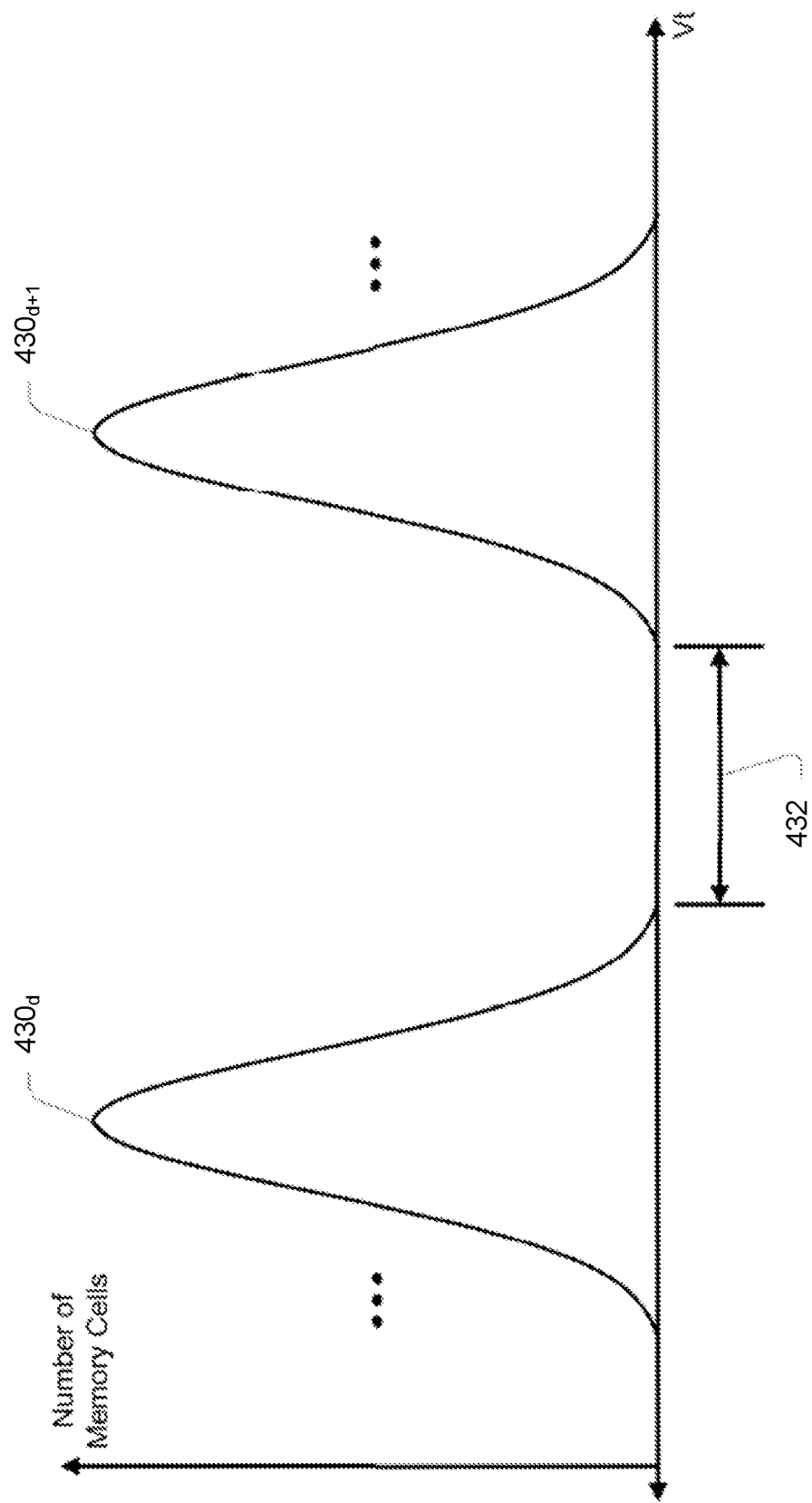
FIG. 4 is a conceptual depiction of a threshold voltage distribution of multiple memory cells at one stage following programming for use with various embodiments.

FIG. 4 is a conceptual depiction of a threshold voltage distribution of multiple memory cells following a programming operation. The threshold voltage distributions $430_d$-$430_{d+1}$ of FIG. 4 can represent some portion of the distributions for threshold voltage ranges $330_0$-$330_{15}$ of FIG. 3 at the completion of a programming operation for memory cells. With reference to FIG. 4, adjacent threshold voltage distributions 430 are typically separated by some read window margin 432 (e.g., dead space) at the completion of programming. Applying a sense voltage (e.g., read level voltage) within the read window margin 432 to the control gates of the multiple memory cells can be used to distinguish between the memory cells of the threshold voltage distribution $430_d$ (and any lower threshold voltage distribution) and the memory cells of the threshold voltage distribution $430_{d+1}$ (and any higher threshold voltage distribution).

Due to the phenomenon known as slow charge loss (SCL), the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage is changing rapidly at first (immediately after the memory cell was programmed, referred to as quick charge loss (QCL)), and then slows down in an approximately logarithmic linear fashion with respect to the time elapsed since the cell programming event. This temporal voltage shift, if left unadjusted, reduces the read window margin 432 between the threshold voltage distributions $430_d$-$430_{d+1}$ over time, and can cause these threshold voltage distributions to overlap, making it more difficult to distinguish between adjacent threshold voltage distributions.

FIG. 5A is a graph illustrating an example of a set of threshold voltage distributions, after coarse programming, that are not readable according to at least one embodiment. Coarse programming can be compared to initial pass programming in which the Vt distributions are highly overlapped when coarse programming many Vt distributions, e.g. as is the case in programming QLC memory. Due to this overlapping of the Vt distributions, the coarse-programmed sets of threshold Vt distributions may also be referred to herein as intermediate Vt distributions. This overlapping occurs due to less precise programming in which each Vt distribution widely covers a range of threshold voltage that coarsely approximates a more accurate (finer) threshold voltage range that is intended for each respective Vt distribution.

FIG. 5B is a graph illustrating the example of the set of threshold voltage distributions (FIG. 5B), after fine programming, that are readable according to at least one embodiment. When fine programming is completed, e.g., to a final set of Vt distributions, each Vt distribution is more finely defined over a focused threshold voltage range intended for each respective logical state. When this occurs, the read window margins between respective Vt distributions are widened such that individual logical states across different memory cells of a set of memory cells can be distinguished when read.

While the overlap between coarsely-programmed Vt distributions is more pronounced in QLC programming, the disclosed consecutive coarse and fine programming operations can be performed on differing types of memory where coarse programming can initially be carried out in a fewer number of intermediate Vt distributions followed by consecutive coarse and fine programming of a larger number of final Vt distributions, as will be discussed. Also, as was mentioned, the touch-up effect of performing fine programming on the set of memory cells after a coarse programming of the same number of Vt distributions leads to improved read window margins (or RWB) and QCL.

Figure 6:
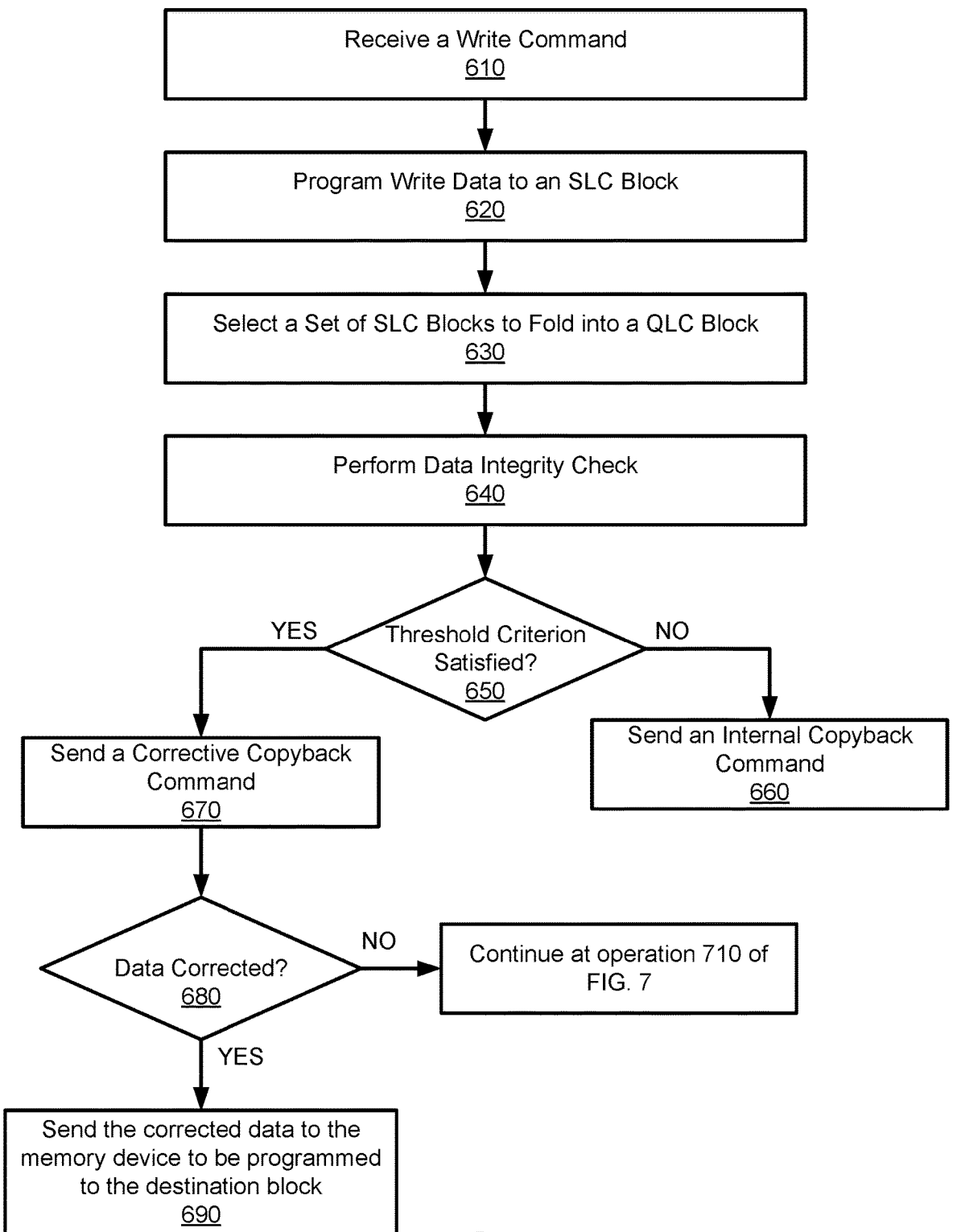
FIG. 6 is a flow diagram of an example method for performing data compaction in response to a write command, in accordance with some embodiments of the present disclosure.

FIG. 6 is a flow diagram of an example method 600 for performing data compaction in response to a write command, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the media management component 113 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The operations of method 600 can relate to performing an internal copyback or a corrective copyback of SLC data to QLC data. However, it is noted that the operations of method 600 can be performed between any types of SLC or HLC data (e.g., SLC to HLC, SLC to SLC, HLC to HLC, or HLC to SLC). Method 600 will be discussed in relation to the copyback operations being performed from a set of SLC source blocks to a QLC destination block. However, it should be understood that method 600 can be performed using any sized memory granularity, such as, but not limited to, a set of SLC source blocks and a HLC destination block, a set of SLC source memory pages and a HLC destination memory page, etc.

At operation 610, the processing logic receives a write command. The write command can be initiated by a host (e.g., host 120) or by a memory sub-system controller (e.g., memory sub-system controller 115). In some embodiments, responsive to receiving the write command, the processing logic can identify a source block(s) in the SLC portion of the memory device (e.g., an SLC cache), and a destination block(s) in a QLC portion of the memory device. In particular, the processing logic can identify (in each the source block and destination block) one or more wordlines that address a set of memory cells (e.g., a page(s)) onto which to program the data referenced by the write command.

At operation 620, the processing logic programs the write data referenced by the write command to a set of SLC blocks.

At operation 630, the processing logic selects a set of SLC blocks (e.g., four SLC memory blocks) from the SLC cache to fold (or compact) into a QLC block. The set of memory pages can be selected at random, sequentially, based on a predefined order, based on address location, etc.

At operation 640, the processing logic performs a data integrity check on the set of SLC blocks. The processing logic can perform the data integrity check on at least a portion of the data from the set of SLC blocks. In some embodiments, the data integrity check can include reading data from a set of sampled memory cells in the set of SLC blocks. In some embodiments, the set of sampled memory cells in the SLC blocks can be one or more memory cells, pages, a wordlines, a group of wordlines in the block, a data portion, or any combination thereof. In some embodiments, the set of sampled memory cells can be selected randomly, can be a predetermined group (e.g., the first, twentieth, and fortieth page of an SLC block), can be a rotating group, etc.

The data integrity check can verify that the data stored at memory cells does not include any errors, or that the number of errors are below a predetermined threshold. During a scan operation, the processing logic identifies one or more data integrity metrics, such as the bit error count (BEC) or the raw bit error rate (RBER), representing a number of bit errors per unit of time that the data stored at the data block experiences. In some embodiments, during the data integrity check, the processing logic reads a raw code word (i.e., a series of a fixed number of bits) from the page. The processing logic can apply the code word to an error correcting code (ECC) decoder to generate a decoded code word and compare the decoded code word to the raw code word. The processing logic can count a number of flipped bits between the decoded code word and the raw code word, with a ratio of the number of flipped bits to the total number of bits in the code word representing the RBER.

At operation 650, the processing logic determines whether a value of the data integrity metric (e.g., a BEC value, a RBER value, etc.) satisfies a threshold criterion (e.g., meets or exceeds a threshold value, is lower than a threshold value, etc.). The threshold criterion can be determined and set during manufacturing of the memory sub-system 110 or during programming and/or calibration of the memory sub-system 110. In an example, the processing logic can determine whether an RBER value or a BEC value exceeds a threshold value. If the data integrity metric satisfies a threshold criterion (e.g., BEC or RBER value is above a threshold value), indicating a high error rate associated with data stored on the set of memory pages, the processing logic proceeds to operation 670. If the data integrity metric fails to satisfy the threshold criterion (e.g., BEC or RBER value is below a threshold value), the processing logic proceeds to operation 660, where the processing logic sends, to the memory device, an internal copyback command with respect to the set of SLC blocks.

At operation 660, the processing logic sends, to the memory device, an internal copyback command with respect to the source block. More specifically, the processing logic generates an internal copyback command that identifies a set of the source memory cells that store data to be copied to a set of the destination memory cells. The processing logic then transmits the internal copyback command to the control logic (e.g., of the local media controller 135) to be performed by the control logic. Responsive to receiving the internal copyback command, the control logic can initiate a folding operation with respect to the source blocks by enabling the memory device to perform a copyback of the stored data to the set of the destination memory cells. The data can be programmed to the destination memory cells using coarse-fine programming.

At operation 670, the processing logic sends, to the memory device, a corrective copyback command. The corrective copyback command can be used to detect and correct errors in the source data (e.g., the set of SLC blocks), and then write the corrected data to the destination block (e.g., the SLC block). In some embodiments, the corrective copyback command requests the memory device to send the data, from the set of SLC blocks, to the ECC encoder/decoder 111 to correct errors in the data. In particular, the processing logic can performs a scan of the data by reading the data out from the memory device, decoding the source data according to an error correction code (ECC) algorithm, and performing an error check on the source data. In response to detecting that the data contains an error(s), the processing logic can use one or more ECC-based error-handling techniques to correct the detected error(s). ECC-based error-handling techniques can be hardware or software based procedures or operations used by the memory sub-system controller to correct an error.

In some embodiments, the processing logic can utilize program suspend protocol during the ECC error correction operation. Program suspend protocol allows the processing logic to process subsequently received memory access commands (e.g., read command) to access the memory device on which the write operation is currently being performed. The program suspend protocol can temporarily pause the write operation and enter a suspended state, and the write data of the write command can be stored on one or more page caches (e.g., the SDC).

At operation 680, the processing logic determines whether the ECC-based error-handling techniques corrected the errors in the source data. In one example, the processing logic can determine a data integrity metric value (e.g., a BEC value, a RBER value, etc.) of the corrected data and then determine whether the value satisfy a threshold criterion (e.g., meets or exceeds a threshold value, is lower than a threshold value, etc.), In another example, the processing logic can use the corrected data to generate a XOR value and determine whether the generated XOR value satisfies a threshold criterion (e.g., the XOR value is equal to 0). Responsive to the processing logic determining that the ECC-based error-handling techniques corrected the errors in the source data (or corrected the errors to an acceptable data integrity metric value), the processing logic proceeds to operation 690.

At operation 690, the processing logic sends the corrected data to the memory device to be programmed to the destination block. In some embodiments, the processing logic can select an empty block as the destination block. In other embodiments, the processing logic can identify one or more next available wordlines in a block to which to write the source or corrected data. In some embodiments, the destination block can include HLC memory cells. In some embodiments, the destination block can be selected at operation 610. The data can be programmed to the destination block using coarse-fine programming.

Figure 7:
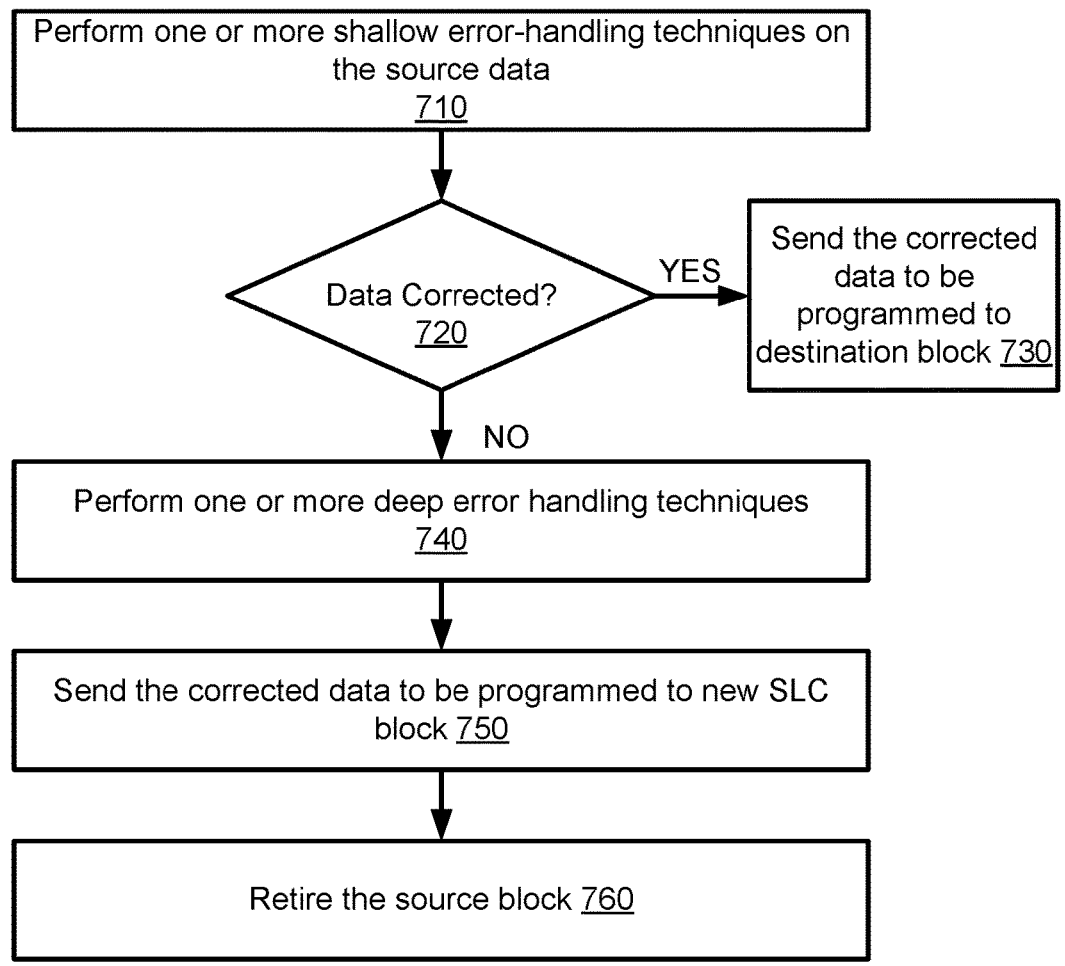
FIG. 7 is a flow diagram of an example method for performing error-handling operations during a copyback command, in accordance with some embodiments of the present disclosure.

Responsive to the processing logic determining that the ECC-based error-handling techniques failed to correct the errors in the source data (or failed to correct the errors to an acceptable data integrity metric value), the processing logic proceeds to operation 710 of FIG. 7.

In some embodiments, the processing logic can proceed directly from operation 650 to operation 710 in response to determining that the value of the data integrity metric satisfies a decisive threshold criterion. For example, the processing logic can proceed directly from operation 650 to operation 710 in response to a BEC value or a RBER value exceeding a threshold value indicating that the source data is uncorrectable using ECC-based error-handling techniques. This threshold value can be set during manufacturing or calibration of the memory sub-system.

FIG. 7 is a flow diagram of an example method 700 for performing error-handling operations during a copyback command, in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the media management component 113 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, the processing logic performs one or more shallow error-handling techniques on the source data. As discussed above, the operations of 710 can be performed in response to the processing logic determining that the ECC-based error-handling techniques failed to correct the errors in the source data. A shallow error-handling operation can include one or more error-handling techniques that can be performed during program suspend protocol. In particular, a shallow error-handling technique can include error-handling operations that do not use significant latch resources (e.g., the PDC and SDC(s)). Thus, shallow error-handling techniques can be performed during the program suspend protocol because they do not require the processing logic to overwrite data stored in a page cache (e.g., the SDC)). The shallow error-handling operations can include techniques capable of correcting data errors without overwriting latch data stored in a page cache. In some embodiments, the processing logic can use parallel auto read calibration (pARC) techniques or single bit soft bit read (SBSBR) techniques. SBSBR techniques generates soft bit information for low-density parity-check soft decode operations and can leverage a single data latch (e.g., an SDC). Thus, SBSBR techniques can perform error checking operations using a single data latch while the processing logic can use the additional data latches during program suspend operation. PARC techniques use few data latches to perform error checking operations with relatively lower range and accuracy, which enable the pARC techniques to be used during program suspend.

At operation 720, the processing logic determines whether the shallow error-handling techniques corrected the errors in the source data. In one example, the processing logic can determine a data integrity metric value (e.g., a BEC value, a RBER value, etc.) of the corrected data and then determine whether the value satisfy a threshold criterion (e.g., meets or exceeds a threshold value, is lower than a threshold value, etc.), In another example, the processing logic can use the corrected data to generate a XOR value and determine whether the generated XOR value satisfies a threshold criterion (e.g., the XOR value is equal to 0). Responsive to the processing logic determining that the shallow error-handling techniques corrected the errors in the source data (or corrected the errors to an acceptable data integrity metric value), the processing logic proceeds to operation 730. Responsive to the processing logic determining that the shallow error-handling techniques failed to correct the errors in the source data (or failed to correct the errors to an acceptable data integrity metric value), the processing logic proceeds to operation 740.

At operation 730, the processing logic sends the corrected data to the memory device to be programmed to the destination block. In some embodiments, the processing logic can select an empty block as the destination block. In other embodiments, the processing logic can identify one or more next available wordlines in a block to which to write the source or corrected data. In some embodiments, the destination block can include HLC memory cells. In some embodiments, the destination block can be selected at operation 610 of FIG. 6. The data can be programmed to the destination block using coarse-fine programming.

At operation 740, the processing logic exits the copyback operation and performs one or more deep error-handling techniques on the data. Exiting the copyback operation can also include exiting the program suspend protocol, thus allowing new data to be programmed using latch resources. A deep error-handling technique can include a redundant array of independent NAND (RAIN) scheme, a forward error correction (FEC) scheme, a hybrid automatic repeat request (HARQ) scheme, corrective read techniques (performing re-read operations using different read voltages), ARC schemes, etc. A RAIN scheme provides redundancy for the data stored on the memory sub-system. When host data (or one or more codewords) is received from the host system to be programmed to a memory device of the memory sub-system, a memory sub-system controller can generate redundancy metadata based on one or more exclusive-or (XOR) operations with the received host data and can use the redundancy metadata to reconstruct or recalculate the host data in the event of a failure of a portion of the memory device that is storing host data. As an example, the memory sub-system controller can generate one or more RAIN standard codewords (redundancy metadata) based on an XOR operation applied to host data stored at a particular number of data locations of one or more logical units (LUNs) (e.g., a page, a block) of the memory sub-system. If a portion of a memory device storing the host data fails and the corresponding data is lost or corrupted, the memory sub-system controller can reconstruct the lost/corrupted data based on an XOR operation among the rest of the host data and the redundancy metadata. The FEC scheme enable the memory sub-system controller to perform error corrections using a redundant error-correcting code and a data frame. The memory sub-system controller performs necessary checks based upon the redundant bits in the data. The HARQ scheme is a combination of the FEC scheme and automatic repeat request (ARQ) error-control.

At operation 750, the processing logic sends the corrected data to the memory device to be programmed to a new SLC block. After programing the corrected data, the processing logic can perform data compaction operations (e.g., the operations of method 600) on the corrected data stored on the new SLC block.

At operation 760, the processing logic retires the source block. The retired data block will no longer used to store data by the processing logic. In an example, the processing logic can mark the block as retired in a look-up table, a data structure, etc.

In some embodiments, at operation 680 of FIG. 6, responsive to the processing logic determining that the ECC-based error-handling techniques failed to correct the errors in the source data (or failed to correct the errors to an acceptable data integrity metric value), the processing logic proceeds to operation directly to operation 740 of FIG. 7. In particular, the processing logic can exit the copyback operation and perform one or more deep error-handling techniques.

Figure 8:
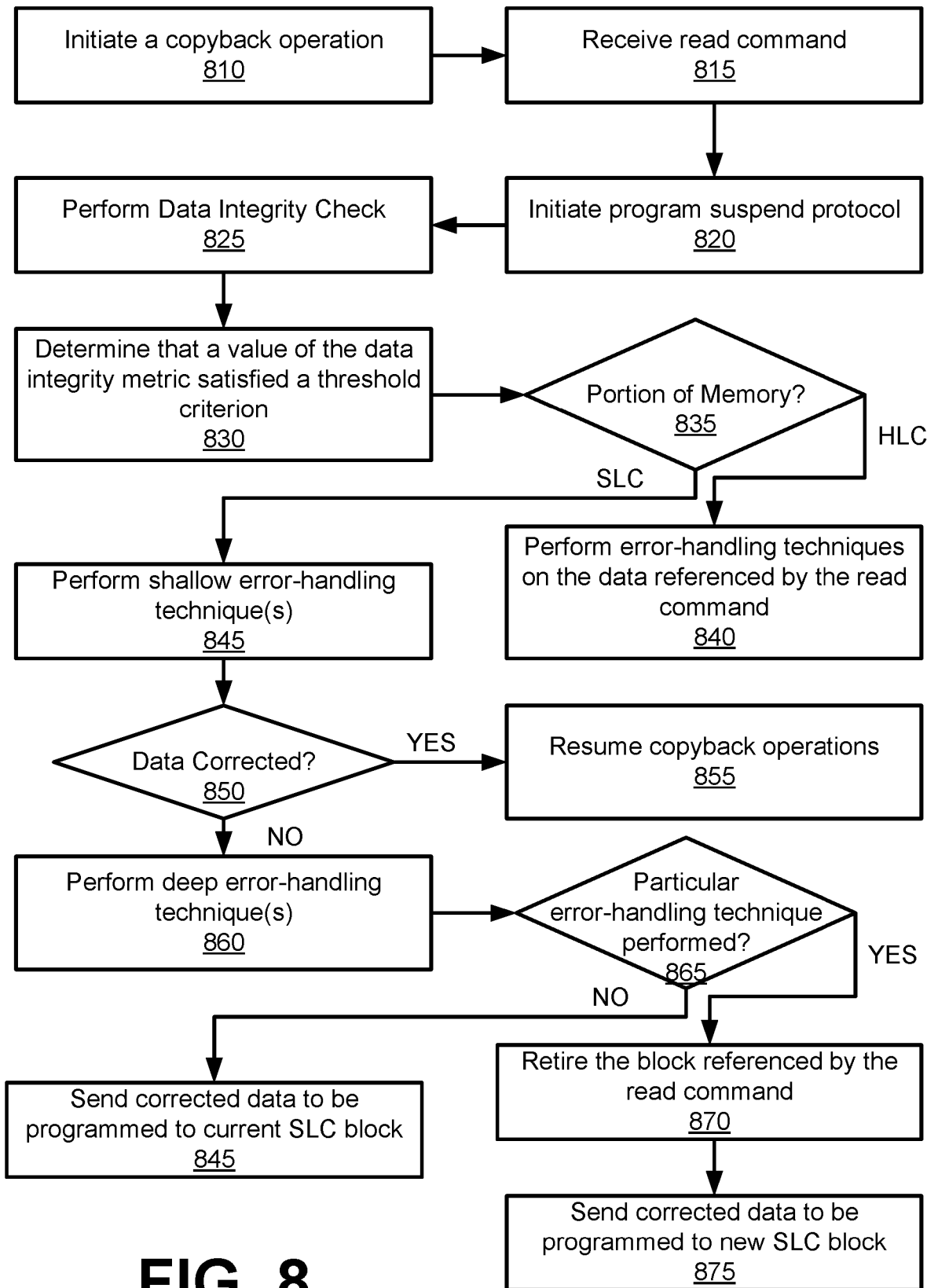
FIG. 8 is a flow diagram of an example method for performing error-handling operations in response to a receiving a memory access command during a copyback operation, in accordance with some embodiments of the present disclosure.

FIG. 8 is a flow diagram of an example method 800 for performing error-handling operations in response to a receiving a memory access command during a copyback operation, in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the media management component 113 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, the processing logic can initiate a copyback operation. For example, the processing logic can initiate a corrective copyback operation or an internal copyback operation, as discussed in method 600.

At operation 815, while performing operations related to the copyback operation (e.g., during any operation of method 600), the processing logic receives a memory access command (e.g., a read command). The read command can be initiated by a host (e.g., host 120) or by a memory sub-system controller (e.g., memory sub-system controller 115). In some embodiments, the memory sub-system controller can issue a read command during a maintenance operation, such as a garbage collection operation.

At operation 820, the processing logic initiates a program suspend protocol. In particular, the processing logic can suspend performing the operations related to the copyback operation.

At operation 825, the processing logic performs a data integrity check on one or more blocks referenced by the read command. The processing logic can perform the data integrity check on at least a portion of the data from the block(s). In some embodiments, the data integrity check can include reading data from a set of sampled memory cells in the block(s). In some embodiments, the set of sampled memory cells in the block(s) can be one or more memory cells, pages, a wordlines, a group of wordlines in the block, a data portion, or any combination thereof.

At operation 830, the processing logic determines that a value of the data integrity metric (e.g., a BEC value, a RBER value, etc.) satisfies a threshold criterion (e.g., meets or exceeds a threshold value) indicating a high error rate associated with data stored on the set of memory pages. The threshold criterion can be determined and set during manufacturing of the memory sub-system 110 or during programming and/or calibration of the memory sub-system 110. In an example, the processing logic can determine that an RBER value or a BEC value exceeds a threshold value.

At operation 835 determines whether the read command references a SLC portion of memory or a HLC portion of memory. In some embodiments, the processing logic can determine the type of memory (e.g., SLC or HLC memory) by determining the address space referenced by the read command. For example, the processing logic can determine whether the address space referenced by the read command is located in a section of memory that contains and SLC block(s) or an HLC block(s). Responsive to determining that the read command references an HLC portion of memory (e.g., QLC memory), the processing logic proceeds to operation 840. Responsive to determining that the read command references a SLC portion of memory, the processing logic proceeds to operation 845.

At operation 840, the processing logic performs one or more error-handling techniques on the data referenced by the read command. The error handling techniques can include shallow error-handling techniques, deep error-handling techniques, or any other error-handling techniques. This can be because, in some embodiments, the memory sub-system controller can be configured to perform certain error handing techniques on QLC blocks that the memory sub-system controller is not configured to perform on SLC, MLC and/or TLC blocks. Some techniques such as Corrective Read and ARC utilize multiple buffers and cannot be used during program operation when programming data resides in the latches. QLC specific error handling features such as pARC (parallel ARC) and bmSBSBR (boost modulated SBSBR) are supported during program operations as they don't need extra latches.

At operation 845, the processing logic performs one or more shallow error-handling techniques on the data referenced by the read command. As discussed above, a shallow error-handling operation can include one or more error-handling techniques that can be performed during program suspend protocol.

At operation 850, the processing logic determines whether the shallow error-handling techniques corrected the errors in the data. In one example, the processing logic can determine a data integrity metric value (e.g., a BEC value, a RBER value, etc.) of the corrected data and then determine whether the value satisfy a threshold criterion (e.g., meets or exceeds a threshold value, is lower than a threshold value, etc.), In another example, the processing logic can use the corrected data to generate a XOR value and determine whether the generated XOR value satisfies a threshold criterion (e.g., the XOR value is equal to 0). Responsive to the processing logic determining that the shallow error-handling techniques corrected the errors in the data (or corrected the errors to an acceptable data integrity metric value), the operation related to the read command can be completed by the processing logic, and the processing logic proceeds to operation 855 where the processing logic resumes the copyback operation initiated in operation 810. Responsive to the processing logic determining that the shallow error-handling techniques failed to correct the errors in the data (or failed to correct the errors to an acceptable data integrity metric value), the processing logic proceeds to operation 860.

At operation 860, the processing logic exits the copyback operation and performs one or more deep error-handling techniques on the data. Due to the deep error-handling techniques requiring significant latch resources, in some embodiments, the processing logic can also exit the program suspend protocol, thus allowing new data to be programmed using latch resources. In some embodiments, the processing logic can generate corrected data using the deep error-handling techniques.

At operation 865, the processing logic determines whether one or more particular deep error-handling techniques were performed (during operation 860) on a block storing data referenced by the read command. For example, the processing logic can determine whether a RAIN operation was performed on a block storing data referenced by the read command. Responsive to the processing logic determining that one or more particular deep error-handling techniques were performed on a block storing data referenced by the read command, the processing logic proceeds to operation 870. Responsive to the processing logic determining that one or more particular deep error-handling techniques were not performed on a block storing data referenced by the read command, the processing logic proceeds to operation 880, At operation 870, the processing logic retires the block referenced by the read command. The retired block will no longer used to store data by the processing logic. In an example, the processing logic can mark the block as retired in a look-up table, a data structure, etc.

At operation 875, the processing logic sends the corrected data to the memory device to be programmed to a new SLC block. After programing the corrected data, the processing logic can initiate copyback operations using the new SLC block.

At operation 880, the processing logic sends the corrected data to the memory device to be programmed to the current SLC block (e.g., the SLC block referenced by the read command). After programing the corrected data, the processing logic can initiate copyback operations on the current SLC block.

Figure 9:
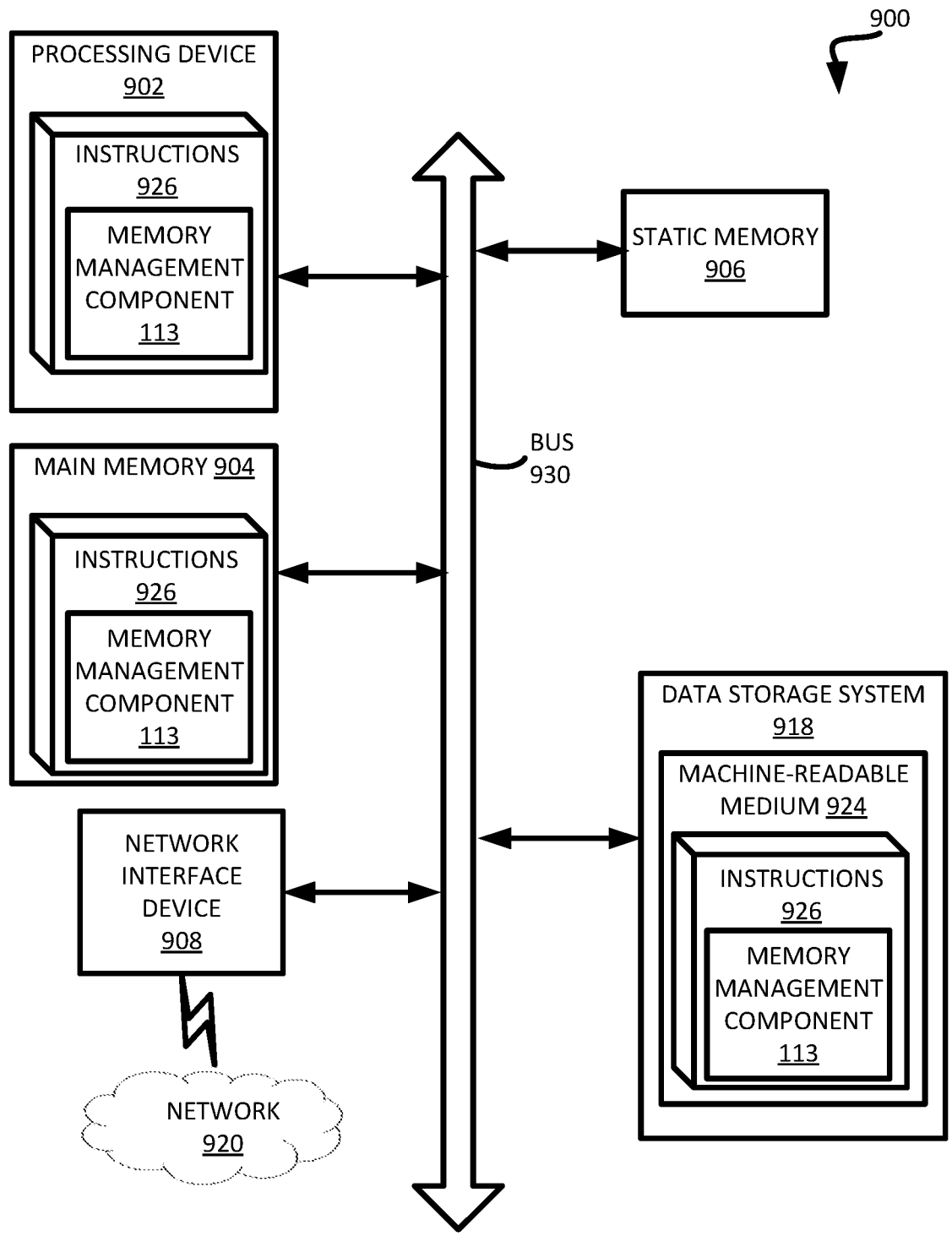
FIG. 9 is a block diagram of an example computer system in which embodiments of the present disclosure can operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1A) that includes or utilizes a memory sub-system (e.g., the memory sub-system 110 of FIG. 1A) or can be used to perform the operations of a controller (e.g., to execute an operating system to perform operations corresponding to media management component 113 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930. Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1A.

In one embodiment, the instructions 926 include instructions to implement functionality corresponding to media management component 113 of FIG. 1A. While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a memory device; and
    a processing device, operatively coupled to the memory device, to perform operations comprising:
        selecting a source set of memory cells of the memory device, wherein the source set of memory cells are configured to store a first number of bits per memory cell;
        performing a data integrity check on the source set of memory cells to obtain a data integrity metric value;
        determining whether the data integrity metric value satisfies a threshold criterion;
        responsive to determining that the data integrity metric value satisfies the threshold criterion, performing a first error-handling operation on the data stored on the source set of memory cells to generate corrected data;
        responsive to determining that the first error-handling operation fails to correct the data, performing a second error-handling operation on the data; and
        responsive to determining that the second error-handling operation corrects the data, causing the memory device to copy the corrected data to a destination set of memory cells of the memory device, wherein the destination set of memory cells are configured to store a second number of bits per memory cell, wherein the second number of bits per memory cell is greater than the first number of bits per memory cell.

2. The system of claim 1, wherein the first error-handling operation comprises an error correction code (ECC) operation.

3. The system of claim 1, wherein the second error-handling operation comprises an error-handling operation that does not use latch resources.

4. The system of claim 1, wherein the processing device is to perform further operations comprising:
    responsive to determining that the second error-handling operation fails to correct the data, performing a third error-handling operation on the data, wherein the third error-handling operation comprises an error-handling operation that uses latch resources.

5. The system of claim 4, wherein the processing device is to perform further operations comprising:
    responsive to determining that the third error-handling operation corrects the data, causing the memory device to copy the corrected data to a new destination set of memory cells of the memory device, wherein the new destination set of memory cells are configured to store the first number of bits per memory cell.

6. The system of claim 4, wherein the processing device is to perform further operations comprising:
    responsive to determining that the second error-handling operation fails to correct the data, retiring the source set of memory cells of the memory device.

7. The system of claim 1, wherein the source set of memory cells are configured as single-level cell (SLC) memory.

8. The system of claim 1, wherein the destination set of memory cells are configured as higher-level cell (HLC) memory.

9. The system of claim 1, wherein the data integrity metric value reflects at least one of a bit error count (BEC) value or a raw bit error rate (RBER) value.

10. A method, comprising:
    selecting, by a processor, a source set of memory cells of a memory device, wherein the source set of memory cells are configured to store a first number of bits per memory cell;
    performing a data integrity check on the source set of memory cells to obtain a data integrity metric value;
    determining whether the data integrity metric value satisfies a threshold criterion;
    responsive to determining that the data integrity metric value satisfies the threshold criterion, performing a first error-handling operation on the data stored on the source set of memory cells to generate corrected data;
    responsive to determining that the first error-handling operation fails to correct the data, performing a second error-handling operation on the data; and
    responsive to determining that the second error-handling operation corrects the data, causing the memory device to copy the corrected data to a destination set of memory cells of the memory device, wherein the destination set of memory cells are configured to store a second number of bits per memory cell, wherein the second number of bits per memory cell is greater than the first number of bits per memory cell.

11. The method of claim 10, wherein the first error-handling operation comprises an error correction code (ECC) operation.

12. The method of claim 10, wherein the second error-handling operation comprises an error-handling operation that does not use latch resources.

13. The method of claim 10, further comprising:
    responsive to determining that the second error-handling operation fails to correct the data, performing a third error-handling operation on the data, wherein the third error handling operation comprises an error-handling operation that uses latch resources.

14. The method of claim 13, further comprising:
    responsive to determining that the third error-handling operation corrects the data, causing the memory device to copy the corrected data to a new destination set of memory cells of the memory device, wherein the new destination set of memory cells are configured to store the first number of bits per memory cell.

15. The method of claim 13, responsive to determining that the second error-handling operation fails to correct the data, retiring the source set of memory cells of the memory device.

16. The method of claim 10, wherein the data integrity metric value reflects at least one of a bit error count (BEC) value or a raw bit error rate (RBER) value.

17. The method of claim 10, wherein the source set of memory cells are configured as single-level cell (SLC) memory.

18. The method of claim 10, wherein the destination set of memory cells are configured as higher-level cell (HLC) memory cells.

19. A non-transitory computer-readable storage medium comprising instructions that, when executed by a processing device operatively coupled to a memory, performs operations comprising:
- selecting a source set of memory cells of a memory device, wherein the source set of memory cells are configured to store a first number of bits per memory cell;
- performing a data integrity check on the source set of memory cells to obtain a data integrity metric value;
- determining whether the data integrity metric value satisfies a threshold criterion;
- responsive to determining that the data integrity metric value satisfies the threshold criterion, performing a first error-handling operation on the data stored on the source set of memory cells to generate corrected data;
- responsive to determining that the first error-handling operation fails to correct the data, performing a second error-handling operation on the data; and
- responsive to determining that the second error-handling operation corrects the data, causing the memory device to copy the corrected data to a destination set of memory cells of the memory device, wherein the destination set of memory cells are configured to store a second number of bits per memory cell, wherein the second number of bits per memory cell is greater than the first number of bits per memory cell.

20. The non-transitory computer-readable storage medium of claim 19, wherein the processing device is to perform further operations comprising:
- responsive to determining that the second error-handling operation fails to correct the data, performing a third error-handling operation on the data, wherein the third error-handling operation comprises an error-handling operation that uses latch resources.

* * * * *